United States Patent [19]

Menasco

[11] Patent Number: 5,045,969
[45] Date of Patent: Sep. 3, 1991

[54] KEYED DISCONNECT OF ELECTRIC SERVICE AT AN ELECTRIC METER LOCATION

[75] Inventor: Steven G. Menasco, Brentwood, Tenn.

[73] Assignee: CIC Systems, Inc., Brentwood, Tenn.

[21] Appl. No.: 473,572

[22] Filed: Feb. 1, 1990

[51] Int. Cl.⁵ .............................................. H02B 1/00
[52] U.S. Cl. ..................................... 361/364; 361/366
[58] Field of Search ................ 200/52 R, 11 C, 43.04; 361/364, 366, 367, 368, 372–375

[56] References Cited

U.S. PATENT DOCUMENTS 3,167,690  1/1965  Wallman ............................. 361/364
3,599,047  8/1971  Magarian ......................... 361/367 X
3,643,044  2/1972  Batcheller ..................... 200/11 C X

OTHER PUBLICATIONS

ASCO 913 Remote Control Switches for Load Management Control, Automatic Switch Co. catalog, copyright 1983.
Chicago Lock Co. catalog, copyright 1987.

Primary Examiner—J. R. Scott
Attorney, Agent, or Firm—Merchant, Gould, Smith, Edell, Welter & Schmidt

[57] ABSTRACT

A mechanically-latching disconnect switch between an electric meter and an electric meter socket permits key controlled disconnections and connections of electric service at the customer location. The disconnect switch is contained in a housing, which contains a key-activated switch. A key may be inserted into a weather-protected slot of the housing. By turning the key in one direction or the other, thereby activating a solenoid connected to the key-activated switch, the solenoid alternately opens and closes the disconnect switch.

1 Claim, 2 Drawing Sheets

KEYED DISCONNECT OF ELECTRIC SERVICE AT AN ELECTRIC METER LOCATION

BACKGROUND OF THE INVENTION

1. Field of the Invention

This invention relates to an apparatus for turning electric utility service off or on at an electric meter location using a keyed switch.

2. Description of Related Art

Electric utility service is typically provided through an electric meter, which in the U.S. is usually mounted in a meter socket located on an outside wall of a building. When a utility company desires to disconnect electric service at the location, the standard practice is to remove the meter and to cover the opening in the meter socket with a blank cover plate, or alternatively, to temporarily remove the meter and put insulating boots over the meter contacts, after which the meter is left stored in the sealed socket with no current flowing to the customer. In the prior art, however, there is no switch or other means of connecting or disconnecting service at the meter location.

SUMMARY OF THE INVENTION

To overcome limitations in the prior art described above, and to overcome other limitations that will become apparent upon reading and understanding this specification, the present invention provides a mechanically-latching disconnect switch between an electric meter and an electric meter socket for disconnecting and connecting electric service. The disconnect switch is of sufficient electrical rating and characteristics to open and close a maximumrated load for the service entrance where the electric meter is installed. The disconnect switch is contained in a housing, which may be sealed using standard electric metering seals. The housing contains a key-activated switch, wherein a utility employee inserts a key into a weather-protected slot, and by turning the key in one direction or the other, alternately opens and closes the disconnect switch.

BRIEF DESCRIPTION OF THE DRAWINGS

The invention will be described in more detail by way of example with reference to the accompanying drawings in which numerals refer to the same components throughout the several views, wherein.

DETAILED DESCRIPTION OF THE PREFERRED EMBODIMENT

In the following detailed description, reference is made to the accompanying drawings which form a part hereof and in which is shown by way of illustration a preferred embodiment in which the invention may be practiced. It is to be understood that other embodiments may be utilized and that structural changes may be made without departing from the scope of the present invention.

The preferred embodiment of the present invention provides a key-activated switch for connecting or disconnecting utility service at an electric meter location. Such a switch provides the following benefits:

1. Reduces the time required to disconnect and restore service.
2. Allows disconnect and reconnect of service to be performed by an employee of lower skill level.
3. Eliminates exposure of the employee to energized meter lugs when performing disconnect and reconnect functions.
4. Safely breaks or closes in on heavy electrical loads operating at the location.
5. Minimizes employee physical danger in the event of closing in on a line-to-line fault.
6. Provides a convenient and efficient way to disconnect electric service during fires or other emergencies.

Figure 1A:
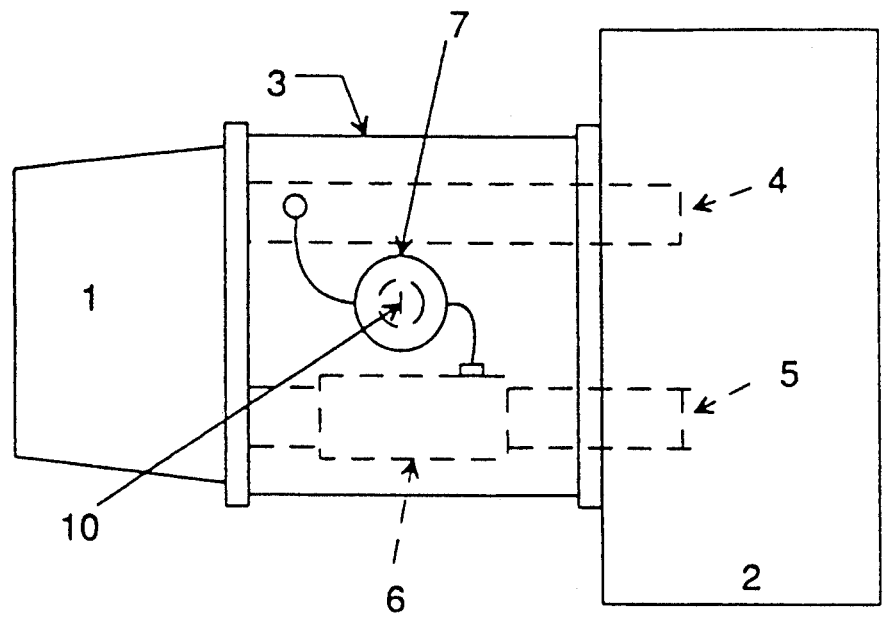
FIG. 1A is a pictorial diagram showing a side view of the electric meter.
Figure 1B:
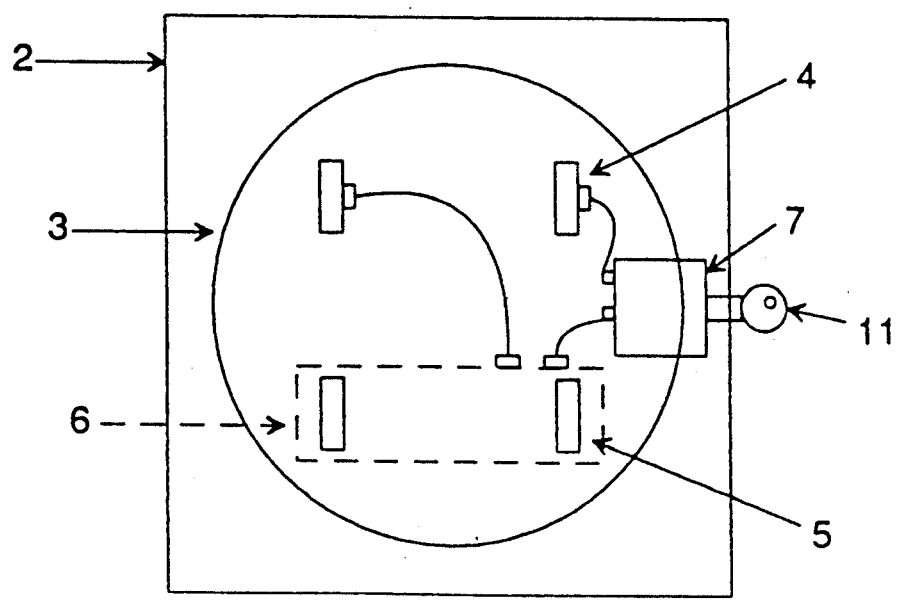
FIG. 1B is a pictorial diagram showing a front view of the electric meter.

FIGS. 1A and 1B are pictorial diagrams showing a side view and a front view of an electric meter according to a preferred embodiment of the present invention. A mechanically-latching disconnect switch (6) is installed on the load side of an electric utility meter (1). The disconnect switch (6) is physically mounted in a metal or plastic sleeve (3). The disconnect switch (6) is activated by turning a key-activated switch (7) which is mounted on a convenient surface of the sleeve (3). The sleeve (3) contains a slot (10) for the key (11) so that its use and operation will not be affected by rain, snow, insects, etc. The key-activated switch (7) should accept a common key (11) unique to the specified utility company, although the key (11) could be unique to the specified location. The sleeve (3) is equipped with line side busses (4) and load-side busses (5) which allow the sleeve (3) to be seated in an electric meter socket (2), with electrical connection being provided through the standard meter socket jaws. The line-side busses (4) and load-side busses (5) are provided with jaws on the front end, which allows the electric meter (1) to be physically and electrically connected in the same manner as provided in a conventional meter socket. This physical arrangement allows easy retrofit to existing meter sockets (2). For new electric meter locations, the disconnect switch (6) may alternatively be installed in the meter socket (2) or some other suitable location.

Figure 2:
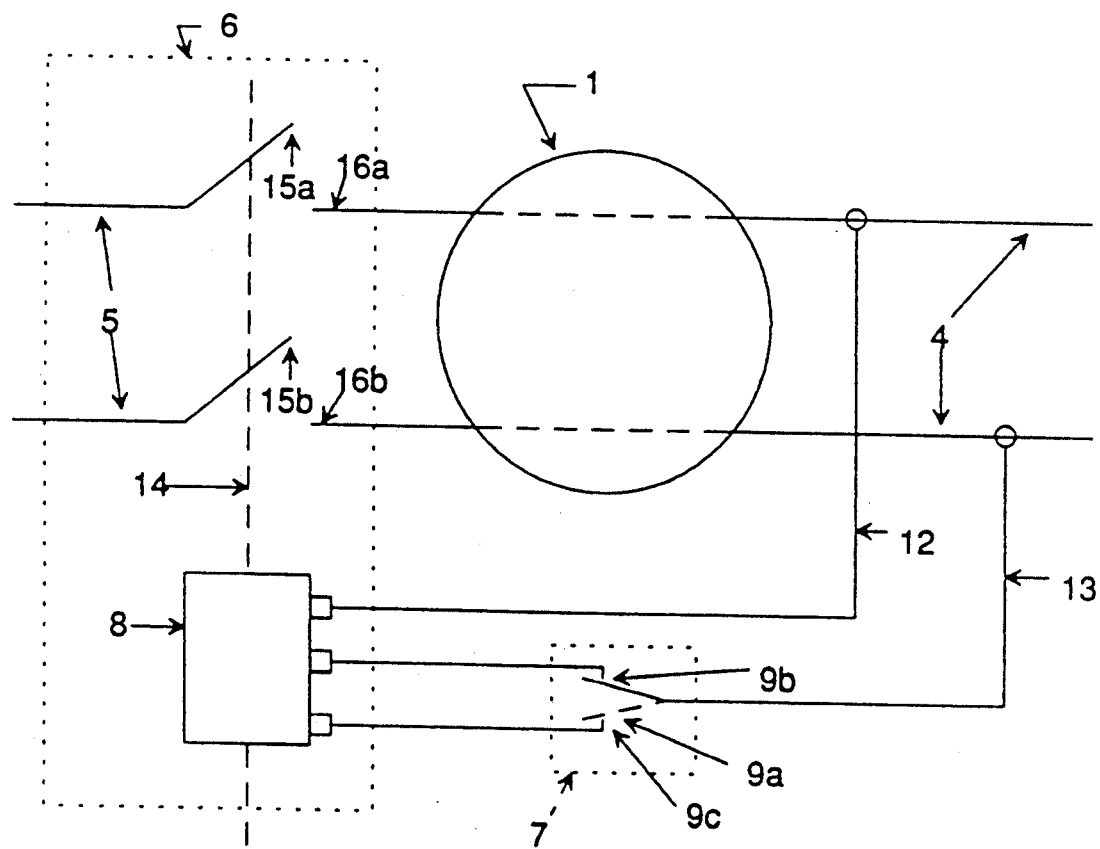
FIG. 2 is a schematic diagram of the wiring arrangement of the disconnect switch and the key-activated switch.

FIG. 2 is a schematic diagram of the wiring arrangement of the disconnect switch (6) and the key-activated switch (7). The key-activated switch (7) is connected via conductors (12) and (13) between line-side busses (4). The key-activated switch (7) is comprised of movable contactor (9a) and contact points (9b) and (9c). If movable contactor (9a) is in contact with contact point (9b), then the key-activated switch energizes the disconnect switch (6). If movable contactor (9a) is in contact with contact point (9c), then the key-activated switch de-energizes the disconnect switch (6).

The disconnect switch (6) contains a solenoid (8) which is energized by the key-activated switch (7). When the solenoid (8) is energized, it causes a conventional reciprocating armature (14) to move the movable contactors (15a) and (15b) to close electrical contact with contact points (16a) and (16b), thereby connecting the electric service. When the solenoid (8) is deenergized, it causes the conventional reciprocating armature (14) to move the movable contactors (15a) and (15b) to open electrical contact with contact points (16a) and (16b), thereby disconnecting the electric service. In the preferred embodiment, the disconnect switch (6) is preferably mechanically-latching, so that a holding current is not required to maintain the disconnect switch (6) in either its open or closed position. The disconnect switch (6) is electrically connected, via conductors (12) and (13) and the key-activated switch (7), between the two line-side busses (4), which pass through the sleeve (3), so that energy is available to operate the disconnect (6) and key-activated (7) switches (8) at all times. The circuit to the solenoid (8) is completed by turning the key-activated switch (7). The key-activated switch (7) is mounted in a convenient surface of the sleeve (3). It should be protected so that its use and operation will not be affected by rain, snow, insects, etc. The key-activated switch (7) should accept a common key unique to the specified utility company, although the key could be unique to the specified location. Rotation of the key in one direction will momentarily close a contactor (9) that provides energy to the solenoid (8). The solenoid (8) then opens the disconnect switch (6). Rotation of the key in the opposite direction momentarily closes the contactor (9) that provides energy to the solenoid (8). The solenoid (8) then closes the disconnect switch (6).

Thus, the preferred embodiment of the present invention provides a mechanically-latching disconnect switch between an electric meter and an electric meter socket for disconnecting and connecting electric service. The disconnect switch is contained in a housing, which contains a key-activated switch. A key may be inserted into a weather-protected slot in the housing, and by turning the key in one direction or the other, the disconnect switch may be alternately opened and closed.

Although a preferred embodiment has been illustrated and described for the present invention, it will be appreciated by those of ordinary skill in the art that any apparatus which is calculated to achieve the same purpose may be substituted for the specific configuration shown. This application is intended to cover any adaptations or variations of the present invention. Therefore, it is manifestly intended that this invention be limited only by the claims and the equivalents thereof.

What is claimed is:

1. A metering system for measuring electric power usage, comprising:
   (a) an electric meter and socket therefor;
   (b) a sleeve adapted for being seated into the socket and for supporting the electric meter, the sleeve having line-side busses and load-side busses so that electrical connection is made between the electric meter and the socket through the busses in the sleeve;
   (c) a disconnect switch, mounted in the sleeve, for enabling the opening and closing of the busses providing the electric power; and
   (d) a key-activated switch mounted in the sleeve adjacent a key slot therein and in electrical connection between the load-side busses and the disconnect switch so as to activate and deactivate the disconnect switch, whereby in turning the key in one direction or the other, the disconnect switch may be alternately opened and closed.

* * * * *